United States Patent [19]
Nakamura et al.

[11] Patent Number: 5,738,732
[45] Date of Patent: Apr. 14, 1998

[54] SOLAR CELL AND MANUFACTURING METHOD THEREOF

[75] Inventors: Kazuyo Nakamura, Nara; Tadashi Hisamatsu, Ibaraki, both of Japan

[73] Assignee: Sharp Kabushiki Kaisha, Osaka, Japan

[21] Appl. No.: 657,289

[22] Filed: Jun. 4, 1996

[30] Foreign Application Priority Data

Jun. 5, 1995 [JP] Japan ................... 7-138218
Mar. 22, 1996 [JP] Japan ................... 8-066421

[51] Int. Cl.$^6$ ................... H01L 31/06; H01L 31/18
[52] U.S. Cl. ................... 136/255; 136/259; 136/261; 257/436; 257/440; 437/2; 437/5; 437/24
[58] Field of Search ................... 136/249 TJ, 255, 136/259, 261; 257/436, 440; 437/2, 5, 24

[56] References Cited

U.S. PATENT DOCUMENTS

| | | |
|---|---|---|
| 3,615,855 | 10/1971 | Smith ................... 136/255 |
| 3,990,101 | 11/1976 | Ettenberg et al. ................... 136/255 |
| 4,158,577 | 6/1979 | Milnes ................... 136/255 |
| 5,370,747 | 12/1994 | Noguchi et al. . |

FOREIGN PATENT DOCUMENTS

| | | |
|---|---|---|
| 3237338 | 4/1984 | Germany . |
| 60-63968 | 4/1985 | Japan ................... 136/261 |
| 64-71182 | 3/1989 | Japan . |
| 4-168769 | 6/1992 | Japan . |
| 4-249374 | 9/1992 | Japan . |
| 5-082812 | 2/1993 | Japan . |
| 5-259075 | 8/1993 | Japan . |

OTHER PUBLICATIONS

S. A. Healy et al. *Solar Energy Materials & Solar Cells*, vol. 28, pp. 273–284 (1992).

Michael G. Mauk et al., Thin Silicon Solar Cells with Internal Reflection and Their Fabrication by Solution Growth; Eighteenth IEEE Photovoltaic Specialist Conference—1985; pp. 192–197.

*Primary Examiner*—Aaron Weisstuch

[57] ABSTRACT

A solar cell includes an n type diffusion layer formed on a first main surface side of a p$^-$ type monocrystalline Si substrate, and a p$^+$ type semiconductor layer formed on a second main surface side of substrate and having an energy bandgap narrower than that of Si and a dopant impurity concentration higher than that of substrate.

21 Claims, 7 Drawing Sheets

5,738,732

1

SOLAR CELL AND MANUFACTURING METHOD THEREOF

BACKGROUND OF THE INVENTION

1. Field of the invention

The present invention relates to crystalline silicon solar cells (including space solar cells which can be preferably used as a power supply for an artificial satellite) and improvements to a manufacturing method thereof.

2. Description of the Related Art

As a material for solar cells, whether it is for use in space or terrestrially, crystalline (monocrystalline and polycrystalline) silicon, which is relatively inexpensive and highly reliable, far surpasses other materials such as GaAs in past uses.

FIG. 7(A) is a cross-sectional view schematically showing an example of a conventional monocrystalline silicon solar cell, while FIG. 7(B) shows the energy bands corresponding thereto, with Ev and Ec representing the upper limit of the valence band and the lower limit of the conduction band, respectively. In the cell in FIG. 7(A), an $n^+$ type diffusion layer 2 is formed on the front side of a $p^-$ type monocrystalline silicon substrate 1 which receives light L, and a $p^+$ diffusion layer 3 is formed on the back side. The solar cell in FIG. 7(A) can be manufactured by the following process. A $p^-$type monocrystalline Si substrate 1 having a thickness in the range from 30 μm to 500 μm and a boron concentration of about $1\times10^{15}$ $cm^{-3}$, for example, is prepared. A $p^+$ type diffusion layer 3 containing boron in a concentration as high as about $1\times10^{17}$ $cm^{-3}$ or higher is formed on the back of substrate 1. In the formation of $p^+$ type diffusion layer 3, the front surface of substrate 1 is covered with a mask material such as a silicon oxide film, and substrate 1 is heated in an atmosphere of $BBr_3$ gas and oxygen to a temperature in the range from 500° C. to 1200° C. Oxide containing boron in a high concentration is formed over the entire substrate 1, the high concentration boron is diffused in a solid phase only through the unmasked back side of substrate 1. After removal of the oxide and the mask material on substrate 1, an $n^+$ type diffusion layer 2 containing phosphorus having a concentration of about $1\times10^{18}$ $cm^{-3}$ or higher is formed on the front side of substrate 1. In the formation of $n^+$ type diffusion layer 2, the back surface of substrate 1 is covered with a mask material, substrate 1 is heated in an atmosphere of $POCl_3$ gas and oxygen to a temperature in the range from 500° C. to 1200° C. Oxide containing phosphorus in a high concentration is formed over the entire substrate 1 as a result, and the phosphorus is diffused in a solid phase into the substrate only through the unmasked front surface of substrate 1. Finally, after removal of the oxide and the mask material, a front electrode (not shown) of a material such as Ag, Pd, and Ti is formed in a comb form on the front surface of substrate 1, and a back electrode (not shown) of material such as Ag, PD, Ti, and Al is formed on the back surface, thus completing a p-n junction type monocrystalline silicon solar cell.

As described above, in such a general crystalline solar cell, $n^+$ type diffusion layer 2 is formed on the front surface of $p^-$ type substrate 1 to form a p-n junction, variation of dopant impurity concentration level is formed between substrate 1 and $p^+$ diffusion layer 3 on the back side, and thus a potential gradient is formed from the front surface of substrate 1 to the back surface as illustrated in FIG. 7(B). Note that the conductivity type of p-n may be reversed in such a cell.

Meanwhile, amorphous solar cells comprising semiconductor thin films having desired compositions and thick-

2 nesses may be deposited in order to form a cell as chemical vapor deposition (CVD) techniques have developed. In general, an n type amorphous silicon thin film containing phosphorus, an i type amorphous silicon thin film free of any impurity, and a p type amorphous silicon thin film containing boron are deposited in this order on a substrate formed of a material such as glass to form a cell having a potential gradient from the light-receiving front surface to the back surface.

There are other known solar cells, among which one has a structure having a potential gradient created by an impurity, and another has a layered structure formed by depositing two or more kinds of semiconductor materials having different band gaps, thus enabling efficient photoelectric conversion adapted to different optical wave lengths. The structure referred to as heterojunction type takes advantage of the fact that light whose energy is smaller than the bandgap of a semiconductor material forming a solar cell substrate (corresponding to long wavelength) cannot be converted into electric energy and the phenomenon of higher voltages being obtainable by electric conversion with larger bandgaps. More specifically, the heterojunction solar cell is intended to achieve efficient photoelectric conversion by providing a plurality of semiconductor layers with different bandgaps corresponding to optical energies (depending on wavelengths). Conventional heterojunction type cells, however, encounter problems related to a mismatch of lattice constants and a mismatch of thermal expansion coefficients between layers, and therefore few applications of heterojunctions to monocrystalline solar cells are known.

A technique similar to such a heterojunction technique is disclosed, for example, in Japanese Patent Laying-Open No. 64-71182. In an amorphous silicon thin film solar cell disclosed therein, a layer containing germanium (Si-Ge alloy) is deposited in the i layer of the p-i-n layers to be deposited by CVD similarly to the other layers and a region whose bandgap is narrower than the other regions is formed in the i layer, in order to improve photoelectric conversion efficiency.

Solar cells are used to convert sunlight with low energy densities into electric power, and therefore it has always been necessary to improve the efficiency of photoelectric conversion. In terms of efficient use of incident energy, almost the entire portion of sunlight having relatively short wavelengths is converted into electric energy in the vicinity of the light-receiving front surface of a solar cell, but part of the light having long wavelengths is not made use of and thus lost.

One approach to solving the problem and using light of long wavelengths may be to change the bandgap of a substrate within a solar cell and form such a structure capable of photoelectric conversion even with low energy light of long wavelengths.

However, in general, it is difficult to change the bandgap with a monocrystalline Si substrate. This is because the bandgap within a monocrystal having a homogeneous physical property is by nature homogeneous all over. As for combination with other semiconductor materials, it is not easy to obtain good matching of lattice constants and thermal expansion coefficients between deposited layers as described above.

Meanwhile, in a film formed of amorphous silicon or polycrystalline silicon which permits constants of physical properties to change thickness-wise relatively freely there exist various recombination sites for minority carriers such as local energy levels and grain boundaries within the energy bandgap, and the diffusion length of carriers, which strongly influences the conversion efficiency of a solar cell, is shorter than in the case of monocrystals. It is therefore difficult for a solar cell using amorphous silicon or polycrystalline silicon to achieve high efficiency without special design.

The above-described Japanese Patent Laying-Open No. 64-71182 suggests an approach for improvement of the conversion efficiency of an amorphous solar cell. However, since the conversion ability of amorphous silicon as a material itself is not high enough, then simply adding a layer containing Ge to such a simple p-i-n layered structure cannot provide efficiency higher than that achieved by a monocrystalline cell. More specifically, if a Ge layer with a small bandgap is inserted within an i layer, for example, light of short wavelengths not absorbed by a thin p layer on the side of light incidence is subjected to photoelectric conversion in the Ge layer of the i layer, thus impeding efficient use of high energy light. In other words, if the Ge layer in the i layer absorbs much of the incident light, the resultant efficiency would not be much higher than that achieved by a solar cell in which all the layers are formed of Ge. The resultant efficiency would be low, because the bandgap of Ge is smaller than Si.

SUMMARY OF THE INVENTION

In order to solve the above-described problems associated with prior art techniques, it is an object of the present invention to provide a highly efficient solar cell which permits high output voltage and photoelectric conversion of light of long wavelengths in order to provide a large output current.

A solar cell according to an aspect of the invention includes a monocrystalline Si substrate of first type conductivity, a diffusion layer of second type conductivity formed on a first main surface of the substrate, and a semiconductor layer of the first type conductivity formed on the second main surface of the substrate and having an energy bandgap narrower than that of Si and a concentration higher than the impurity concentration of the substrate.

In such a solar cell, a semiconductor layer of a material having a bandgap narrower than Si such as Si-Ge alloy or Ge is formed within a $p^+$ type conductivity layer on the back side of a $p^-$ type Si substrate, for example, and a thin Si diffusion layer of $n^+$ type is formed on the light-receiving surface of the substrate. Light of short wavelengths having high energy is therefore sufficiently photoelectrically-converted by the thin Si diffusion layer of $n^+$ type on the side of light receiving front surface or the relatively thick $p^-$ type Si substrate, and light with long wavelength which has not been converted by the Si can be photoelectrically-converted by the Si-Ge alloy layer or Ge layer on the back surface having a narrower bandgap.

Ideally, the bandgap of Si is 1.12 eV and the bandgap of Ge is 0.66 eV. The bandgap of Si therefore corresponds to light with a wavelength of about 1.11 μm, while the bandgap of Ge corresponds to light with a wavelength of about 1.88 μm. These optical wavelengths correspond to the longest wavelengths of light which can be photoelectrically-converted by Si and Ge in their ideal states, respectively. This indicates that the solar cell according to the present invention permits photoelectric conversion over a wide range of wavelengths.

A method of manufacturing a solar cell according to another aspect of the invention includes the steps of preparing a monocrystalline Si substrate and implanting Ge ions on a back main surface opposite to a front main surface which is the light-receiving surface of the substrate, thereby forming a Si-Ge alloy layer on the back main surface. In the manufacturing method of a solar cell, the Si-Ge alloy layer is formed by means of implantation of Ge ions, and therefore abrupt changes in lattice constants or thermal expansion coefficients in the vicinity of the boundary between the Si region and the Si-Ge alloy layer region in the substrate can be alleviated.

A solar cell according to another embodiment of the invention includes a monocrystalline Si substrate of first type conductivity, a diffusion layer of second type conductivity formed on a first main surface of the substrate, an $Si_{1-x}Ge_x$ ($0<x\leq1$) alloy layer, and an intermediate semiconductor layer formed in at least part of the region along the boundary between the Si substrate and the $Si_{1-x}Ge_x$ alloy layer, and the intermediate semiconductor layer has an intermediate refractive index between those of Si and Ge and a bandgap wider than the energy bandgap of the $Si_{1-x}Ge_x$ alloy layer.

In the solar cell in this aspect, the intermediate semiconductor layer has an intermediate refractive index between Si and Ge and therefore reflects light not absorbed by the Si substrate back into the Si substrate, and therefore light which has not been absorbed by a single passage is guided again into the Si substrate to be absorbed therein. Light not reflected by the intermediate semiconductor layer and transmitted into the $Si_{1-x}Ge_x$ alloy layer is not absorbed by the intermediate semiconductor layer which has a bandgap wider than the bandgap of Si, and can therefore be absorbed in the $Si_{1-x}Ge_x$ alloy layer. The solar cell therefore allows for sufficient photoelectric conversion efficiency even with such a thin Si substrate, and is particularly preferable as a light weight solar cell for space use.

The foregoing and other objects, features, aspects and advantages of the present invention will become more apparent from the following detailed description of the present invention when taken in conjunction with the accompanying drawings which are given by way of illustration only, and thus are not limitative of the present invention.

DESCRIPTION OF THE PREFERRED EMBODIMENTS

In one embodiment of the invention, a monocrystalline Si substrate is prepared, and a Ge layer of a Si-Ge alloy layer having a bandgap narrower than Si is formed within a layer such as a $p^+$ type layer on the back of the substrate. Ge, having the same crystal structure as Si, can form a solid solution type alloy with Si in any concentration. A p-n junction in the vicinity of the light-receiving front surface of Si substrate is the same as in conventional solar cells, but a junction in the vicinity of the back surface is formed between the $p^+$ type. Ge layer or the Si-Ge alloy layer and the $p^+$ type Si diffusion layer, or between the $p^+$ type Ge layer or Si-Ge alloy layer and the $p^-$ type Si substrate.

Thus, high energy light having short wavelengths can be sufficiently photoelectrically-converted by Si within the thin diffusion layer on the light receiving front surface or the relatively thick substrate layer, and the remaining light with long wavelengths which has not been photoelectrically-converted by the Si can be photoelectrically-converted by the Ge layer or the Si-Ge alloy layer having a narrow bandgap upon reaching the $p^+$ diffusion layer at the back surface.

According to the invention, the method of forming such a Ge layer or Si-Ge layer having a narrow bandgap within the $p^+$ diffusion layer on the back surface is not limited to any particular method, and CVD, solid phase growth, and MBE (Molecular Beam Epitaxial) methods can be employed. Formation of such Si-Ge alloy by introducing Ge into the Si substrate by means of ion implantation and depositing a Si-Ge alloy or Ge on a base Si-Ge alloy are suitable for the invention, and therefore these methods will be more specifically described.

Figure 1A:
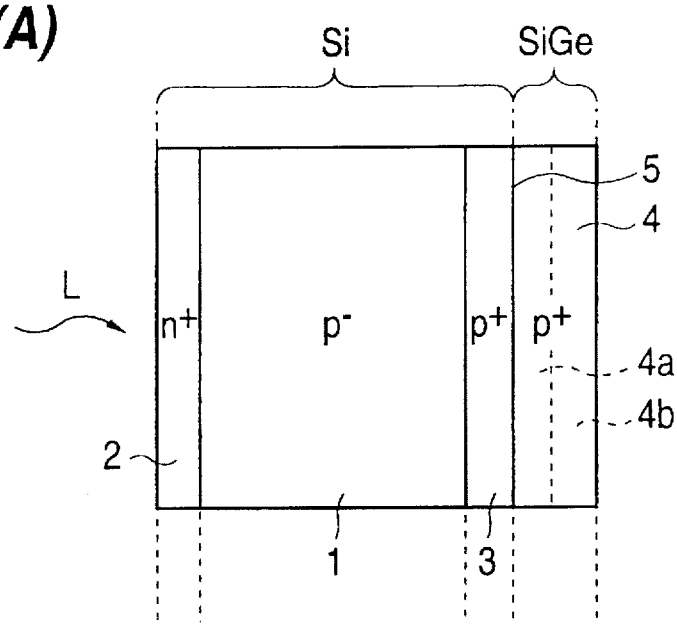
FIGS. 1A and 1B include a cross-sectional view schematically showing an example of a solar cell according to the present invention and a schematic energy band profile corresponding to the cell.
Figure 1B:
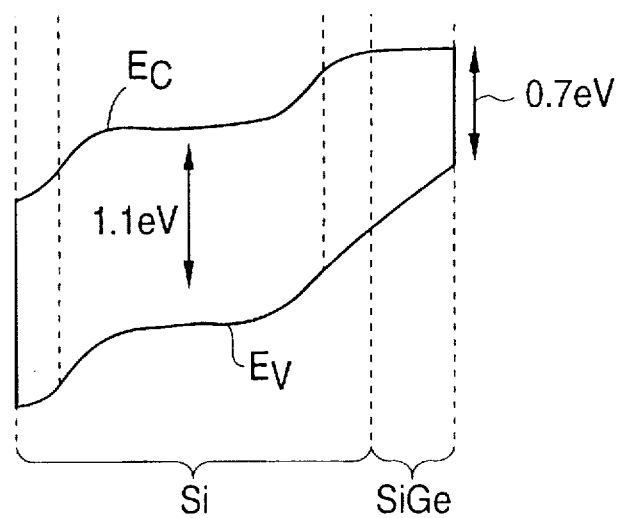

In FIG. 1, (A) is a cross-sectional view schematically showing a solar cell according to one embodiment of the invention, with (B) schematically indicating the structure of the energy bands corresponding to the cell. In the cell in FIG. 1(A), an $n^+$ type diffusion layer 2 is formed on the light receiving front surface of a $p^-$ type Si substrate 1. A $p^+$ type diffusion layer 3 and a $p^+$ type Si-Ge alloy layer 4 are formed on the back surface of substrate 1, with a back surface junction 5 being formed between these layers 3 and 4. The bandgap of Si is about 1.1 eV, and the bandgap of Si-Ge alloy layer is about 0.7 eV.

When the Si-Ge layer essential to the present invention is formed by means of ion implantation, the transition of monocrystalline Si to Si-Ge alloy is gradually effected as compared to the case of depositing a film, and therefore lattice mismatch may be alleviated. When a Si-Ge alloy or Ge is further deposited according to another method on the Si-Ge layer formed by means of ion implantation, similar effects are obtained, and a boundary with less defect density can be obtained as compared to a case of depositing another film directly on the monocrystalline Si surface.

A first example of the manufacturing method of the solar cell shown in FIG. 1 includes a step of manufacturing a Si-Ge alloy layer by means of ion implantation.

A $p^-$ type monocrystalline Si substrate 1 having a thickness in the range from 30 μm to 500 μm and a boron concentration of about $1 \times 10^{15}$ cm$^{-3}$ is prepared. The back surface of substrate 1 is implanted with Ge ions. As for the conditions of implanting Ge ions, the implantation energy is in the range from about 10 keV to 200 keV, desirably 50 keV, and the dose amount is in the range from $1 \times 10^{15}$ to $1 \times 10^{18}$ cm$^{-2}$, desirably $1 \times 10^{16}$ cm$^{-2}$. The thus ion implanted substrate is annealed at a temperature in the range from 500° C. to 900° C., desirably at a temperature of 800° C. for about 120 minutes, and substrate 1 is activated as a result. A Si-Ge alloy layer 4 is thus formed on the back surface of substrate 1.

A $p^+$ type diffusion layer 3 having a dopant concentration as high as $1 \times 10^{17}$ cm$^{-3}$ or higher is formed on the back surface of substrate 1. In the method of forming thereof, the front surface of substrate 1 is covered with a mask material such as silicon oxide, and substrate 1 is heated in an atmosphere of BBr$_3$ gas and oxygen to a temperature in the range from 500° C. to 1200° C. Oxide containing boron in a high concentration is thus formed entirely over substrate 1, and the high concentration boron is diffused in a solid phase only from the back surface of substrate 1 which has not been masked. As a result, a $p^+$ type diffusion layer 3 is formed on the back of silicon substrate 1, and Si-Ge alloy layer 4 attains $p^+$ type conductivity.

Then, after removal of the oxide or mask material on substrate 1, an $n^+$ type diffusion layer 2 having a dopant concentration as high as $1 \times 10^{18}$ cm$^{-3}$ or higher is formed on the front surface. Upon forming $n^+$ type diffusion layer 2, substrate 1 has its back surface covered with a mask material and then is heated in an atmosphere of POCl$_3$ gas and oxygen to a temperature in the range from 500° C. to 1200° C. As a result, oxide containing phosphorus in a high concentration is formed entirely over substrate 1, and the high concentration phosphorus is diffused in a solid phase only on the front surface of substrate 1 which has not been masked.

$N^+$ type diffusion layer 2 on the front surface, i.e., the light receiving surface of Si substrate 1 and $p^+$ type diffusion layer 3 on the back surface are thus formed with Si-Ge alloy layer 4 being formed within the $p^+$ type conductivity layer on the back surface. A back surface junction 5 is formed between $p^+$ type Si diffusion layer 3 and $p^+$ type Si-Ge alloy layer 4.

A second example of the method of manufacturing the cell shown in FIG. 1 includes a step of manufacturing an Si-Ge alloy layer by means of CVD.

In this second manufacturing method, as is the case with the first manufacturing method, a $p^-$ type monocrystalline Si substrate 1 having a thickness in the range from 30 μm to 500 μm and a boron concentration of about $1 \times 10^{15}$ cm$^{-3}$ is prepared. A Si-Ge alloy layer 4 is formed on the back surface of substrate 1 by means of CVD. As for deposition conditions of Si-Ge alloy layer 4, for example, substrate 1 is heated to a temperature of about 300° C. in a sufficiently evacuated vacuum chamber, and introduction of GeH$_4$ gas and SiH$_4$ gas in a mixture ratio of 5 to 1 keeps the pressure therein at 500 mTorr. Then up to 300 W high frequency electric power is fed into the chamber to create a plasma, thereby forming an amorphous layer of a Si-Ge alloy on substrate 1. Substrate 1 is then annealed at a temperature of about 800° C. for about 120 minutes, to crystallize the deposited Si-Ge layer. The crystallized Si-Ge alloy layer 4 is formed on the back surface of substrate 1 as a result.

A $p^+$ diffusion layer having a dopant concentration as high as $1 \times 10^{17}$ cm$^{-3}$ or higher is formed on the back surface of substrate. In the forming method thereof, as is the case with the first manufacturing method, substrate 1 has its front surface covered with a mask material of silicon oxide and is heated in an atmosphere of BBr$_3$ gas and oxygen to a temperature in the range from 500° C. to 1200° C. Oxide containing boron in a high concentration is formed entirely over substrate 1 as a result, and the high concentration boron is diffused in a solid phase only from the side of the back surface of substrate 1 which has not been masked. As a result, a $p^+$ diffusion layer 3 is formed on the back surface of the silicon substrate and Si-Ge alloy layer 4 attains $p^+$ type conductivity.

Then, after removal of the oxide or mask material from substrate 1, an $n^+$ type diffusion layer 2 having a dopant concentration as high as $1\times10^{18}$ cm$^{-3}$ or higher is formed on the front surface of substrate 1. Also, in the formation of n$^+$ diffusion layer 2, as is the case with the first manufacturing method, substrate 1 has its back surface covered with a mask material and is heated in an atmosphere of POCl$_3$ gas and oxygen to a temperature in the range from 500° C. to 1200° C. Thus, oxide containing phosphorus in a high concentration is formed entirely over substrate 1, and the high concentration phosphorus is diffused in a solid phase only on the side of the unmasked front surface of substrate 1.

N$^+$ type diffusion layer 2 on the side of the front surface, i.e., the light receiving surface of Si substrate 1 and p$^+$ type diffusion layer 3 on the back surface are thus formed, with Si-Ge alloy layer 4 being formed within the p$^+$ type conductivity layer on the back surface.

A third example of the manufacturing method of the cell shown in FIG. 1 includes a step of forming a double layer having a narrow bandgap by means of ion implantation and CVD.

In the third manufacturing method, as is the case with the first and second manufacturing methods, a monocrystalline Si substrate 1 having a thickness in the range from 300 μm to 500 μm and a boron concentration of $1\times10^{15}$ cm$^{-3}$ is prepared. Substrate 1 is implanted with Ge ions on its back surface, as is the case with the first manufacturing method. As for the conditions of Ge ion implantation, the implantation energy is for example in the range from about 10 keV to 200 keV, desirably 50 keV and the dose is in the range from $1\times10^{15}$ to $1\times10^{18}$ cm$^{-2}$, desirably $1\times10^{16}$ cm$^{-2}$. The substrate 1 thus implanted with ions is annealed at a temperature in the range from 500° C. to 900° C., desirably at a temperature of 800° C. for about 120 minutes for activation.

Using the thus formed Si-Ge alloy layer 4a (refer to (A) in FIG. 1) as a base, as is the case with the second reaction method, a second Si-Ge alloy layer 4b is formed by means of CVD. As for the conditions of depositing the second Si-Ge layer, substrate 1 is heated to about 300° C. in a sufficiently evacuated vacuum chamber, for example, and introduction of GeH$_4$ gas and SiH$_4$ gas into the chamber in a mixture ratio of 5 to 1 keeps the pressure therein at about 50 mTorr. Up to 300W high frequency electric power is fed into the chamber to create a plasma, and an amorphous layer of Si-Ge alloy is formed on the back surface of substrate 1. Substrate 1 is then annealed at a temperature of about 800° C. for about 120 minutes, thus crystallizing the deposited Si-Ge layer. As a result a Si-Ge alloy layer 4 thicker than the one produced by simply implanting ions on the side of the back surface of the substrate 1 is formed.

A p$^+$ type diffusion layer having a dopant concentration as high as $1\times10^{17}$ cm$^{-3}$ or higher is formed on the back surface of substrate 1. In the method of forming thereof, as is the case with the first and second manufacturing methods, substrate 1 has its front surface covered with a mask material such as silicon oxide and is heated in an atmosphere of BBr$_3$ gas and oxygen to a temperature in the range from 500° C. to 1200° C. Thus, oxide containing boron in a high concentration is formed entirely over substrate 1, and the high concentration boron is diffused in a solid phase only from the side of the back surface of substrate 1 which has not been masked. As a result, a p$^+$ type layer 3 is formed on the back surface of Si substrate 1, and Si-Ge layer 4 attains p$^+$ type conductivity.

After removal of the oxide or the mask material on substrate 1, an n$^+$ type diffusion layer 2 having a dopant concentration as high as $1\times10^{18}$ cm$^{-3}$ or higher is formed on the front surface of substrate 1. In the formation of n$^+$ type diffusion layer 2, as is the case with the first and second manufacturing methods, substrate 1 has its back surface side covered with a mask material and is then heated in an atmosphere of POCl$_3$ gas and oxygen to a temperature in the range from 500° C. to 1200° C. Thus, oxide containing phosphorus in a high concentration is formed entirely over substrate 1, and the high concentration phosphorus is diffused in a solid phase only into the front surface of substrate 1 which has not been masked.

Thus, n$^+$ type diffusion layer 2 on the front surface, i.e., the light receiving surface of Si substrate 1 and p$^+$ type diffusion layer 3 on the back surface are formed, with Si-Ge alloy layer 4 being formed within the p$^+$ type conductivity layer on the back surface.

Note that in the third manufacturing method, a Ge layer may be formed as second layer 4b having a narrow bandgap instead of the Si-Ge layer.

Si-Ge alloy layer 4 having a narrow bandgap may also be formed directly in contact with p$^-$ type substrate 1 without interposing p$^+$ type layer 3.

When the Si-Ge alloy layer or the Ge layer is formed by means of CVD, a gas containing a doping impurity may be mixed into the raw material gas to conduct doping simultaneously with the formation of the layer.

It goes without saying that an anti-reflective shape such as a texture structure including fine concavities and convexities or a passivation film may be formed on the light receiving surface of the solar cell.

In order to achieve sufficient photoelectric conversion efficiency by the solar cell in FIG. 1, it is desirable to convert most of the light in the wavelength region absorbable by Si within the region of the Si substrate 1. The light absorption coefficient of Si is however relatively small, and therefore substrate region 1 desirably has a thickness of several hundreds of μm in order to absorb most of the light which can be converted into electric power by Si in the Si substrate region 1. On the other hand, as the thickness of Si substrate 1 increases, the weight of the solar cell increases, which is not preferable for use as a space solar cell.

Figure 2A:
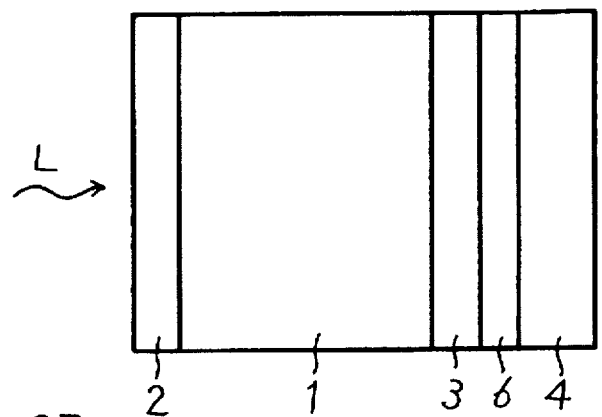
FIGS. 2A, 2B, and 2C are cross-sectional views schematically showing other examples of the solar cell according to the present invention.
Figure 2B:
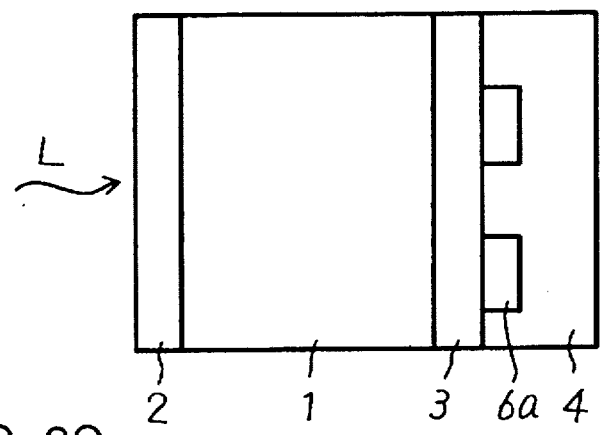
Figure 2C:
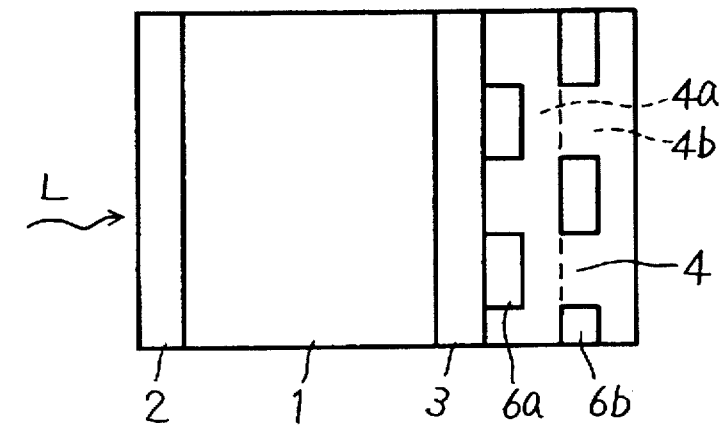

FIGS. 2A, 2B, and 2C schematically show cross-sectional structures of solar cells according to other examples of the invention which can overcome the above-described disadvantage. The solar cells shown in FIGS. 2A to 2C appear similar to the one shown in FIG. 1 but are additionally provided with p$^+$ intermediate semiconductor layers 6, 6a, and 6b, respectively. More specifically, intermediate semiconductor layers 6, 6a, and 6b having refractive indexes smaller than Si and bandgaps larger than p$^+$ type Si$_{1-x}$Ge$_x$ ($0<x\leq1$) layer 4 are formed at least partially along the surfaces parallel to respective Si/SiGe boundaries. The intermediate semiconductor layer reflects light absorbable by Si back into the Si substrate 1 and functions to enhance light absorption within the Si substrate region. In addition, intermediate semiconductor layers 6, 6a, and 6b are each p$^+$-doped, in order to enhance the injection efficiency of minority carriers (electrons) injected from Si$_{1-x}$Ge$_x$ layer 4.

As a material for intermediate semiconductor layers 6, 6a, and 6b, SiO$_x$, SiN$_x$ change their properties between semiconducting and insulating depending upon the amount of O or N. SiC has attracted much attention in recent years particularly as a high temperature electronic material.

TABLE 1

| material | Physical property constant | | |
|---|---|---|---|
| | $n_{0.4}$ | $n_{1.2}$ | Eg (eV) |
| Si | 6.6 | 3.5 | 1.1 |
| Ge | 5.5 | 4.2 | 0.7 |
| $SiO_2$ | 1.6 | 1.6 | 8.5 |
| $Si_3N_4$ | 2.0 | 2.0 | 5.5 |
| SiC | 2.7 | 2.5 | 2.2 |

Table 1 sets forth the refractive indexes n and bandgaps Eg of various materials. In Table 1, $SiO_2$ and $Si_3N_4$ are listed as typical examples of $SiO_x$ and $SiN_x$, respectively. The refractive indexes $n_{0.4}$ and $n_{1.2}$ are for light having wavelengths of 400 nm and 1200 nm, respectively. It is understood from Table 1 that $SiO_2$, $Si_3N$, and SiC have refractive indexes n which are smaller than Si and bandgaps Eg which are larger than Si. Based on these facts, it is noted that $SiO_x$, $SiN_x$, and SiC may be preferably used as materials for intermediate semiconductor layers 6, 6a, and 6b, respectively.

Figure 3:
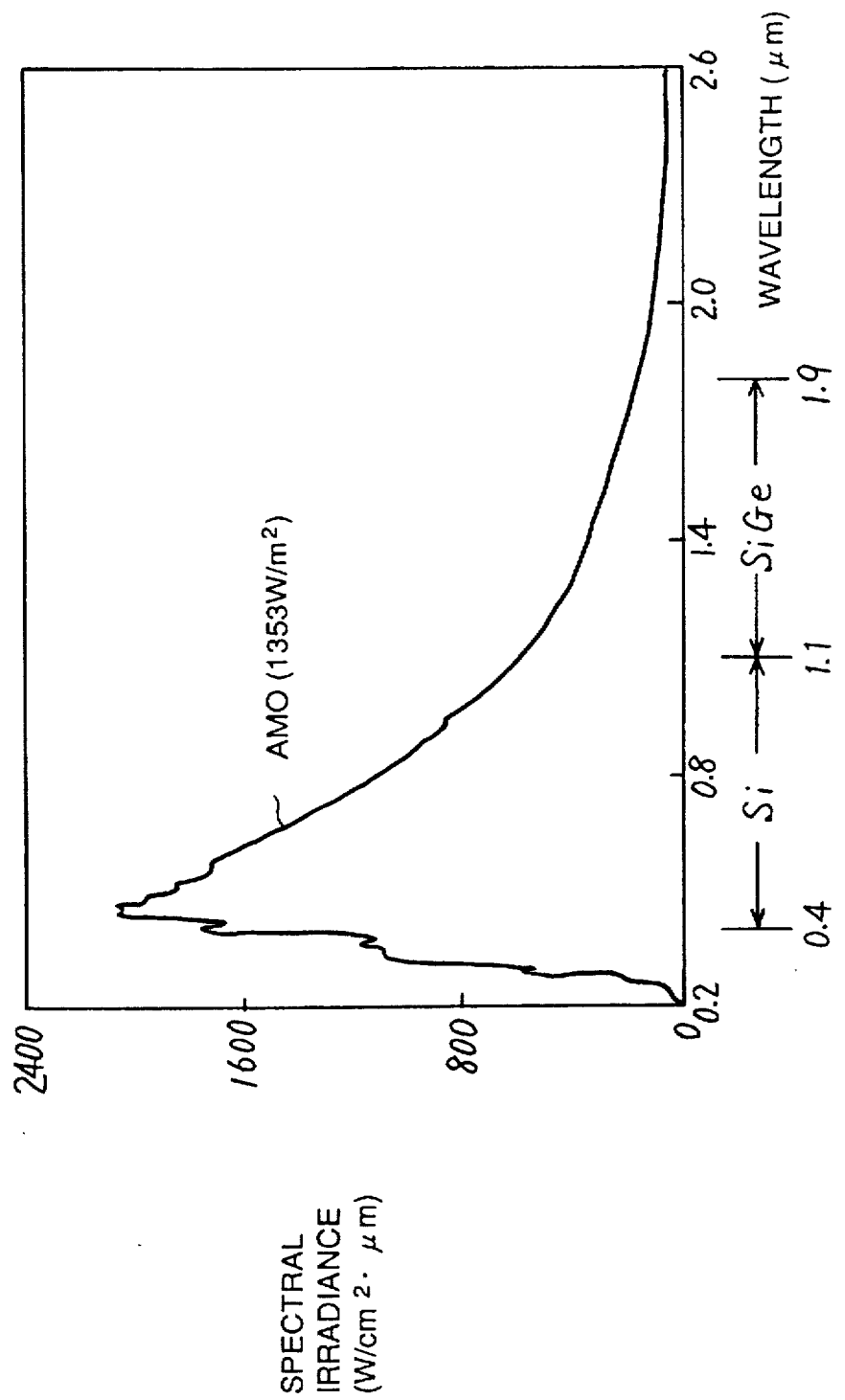
FIG. 3 is a graph showing a spectral distribution of sunlight in space.

FIG. 3 is a graph showing the spectral distribution of sunlight AM0 in space. More specifically, the abscissa of the graph represents optical wavelengths, while the ordinate represents spectral irradiance. In the spectral distribution in FIG. 3, light having a wavelength in the range from about 400 nm to about 1100 nm which corresponds to the bandgap of Si of about 1.1 eV is preferably converted into electric power within the region of Si substrate 1. Rather than allowing minority carriers produced by photoelectric conversion within $Si_{1-x}Ge_x$ layer 4 to pass through back surface junction 5 to form a p⁻ junction, minority carriers produced within the region of Si substrate 1 would apparently have a longer life time. In order to absorb most of the light with a wavelength of about 1100 nm within the region of Si substrate in the solar cell in FIG. 1, however, substrate 1 needs to have a thickness as large as about 500 µm, disadvantageously increasing the weight of the solar cell as the case described above.

Meanwhile, according to the principles of optics, when light enters a material with a small refractive index from a material with a larger refractive index through the boundary between these materials, the light tends to be reflected by the boundary. Provision of intermediate semiconductor layers 6, 6a, and 6b having a refractive index smaller than Si on the back surface of Si substrate 1 causes light to be reflected therefrom and guided back into Si substrate 1. Since an anti-reflective shape such as a texture structure is conventionally provided on the light receiving front surface of a silicon solar cell, light having wavelengths in the range from about 400 nm to about 1100 nm can be sufficiently photoelectrically-converted within the region of Si substrate 1 by multiple reflection between the front surface of the solar cell and intermediate semiconductor layers 6, 6a, and 6b.

Note that intermediate semiconductor layers 6, 6a, and 6b must be transparent to light having wavelengths in the range from about 1100 nm to about 1900 nm to be converted into electric power by $Si_{1-x}Ge_x$ layer 4. More specifically, the bandgaps Eg of intermediate semiconductor layers 6, 6a, and 6b must be larger than the bandgap Eg of $Si_{1-x}Ge_x$. (The largest is about 1.1 ev for Si.)

In the following, the solar cells shown in FIGS. 2A to 2C will be further specifically described.

Figure 4:
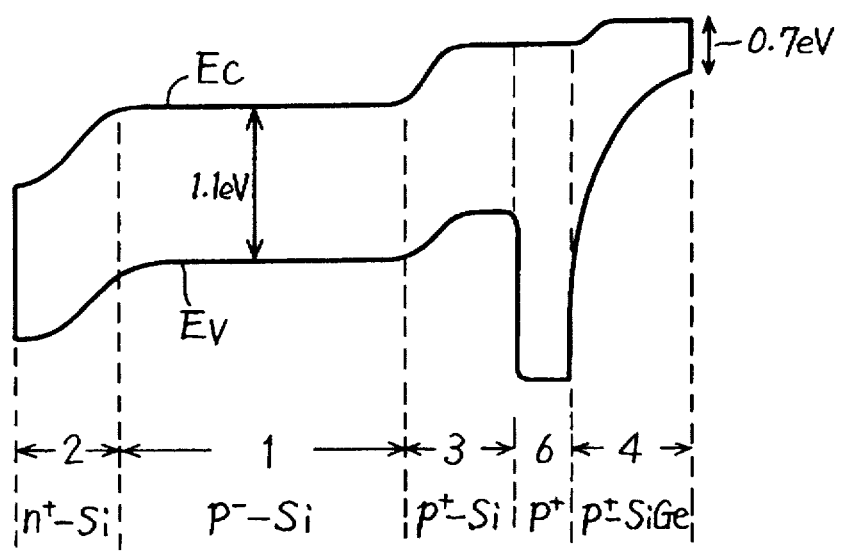
FIG. 4 is a schematic energy band profile corresponding to the solar cell shown in FIG. 2A.

The solar cell in FIG. 2A appears similar to the one in FIG. 1 as described above, but p⁺ type intermediate semiconductor layer 6 is provided along the entire boundary between p⁺ type Si layer 3 and p⁺ type $Si_{1-x}Ge_x$ layer 4 on the back surface of Si substrate 1. FIG. 4 shows an example of an energy band structure corresponding to the solar cell in FIG. 2A. More specifically, intermediate semiconductor layer 6 has a bandgap Eg larger than Si substrate 1. Intermediate semiconductor layer 6 has a refractive index smaller than Si substrate 1 and p⁺ type Si layer 3. Light which has not been absorbed in Si substrate 1 and p⁺ type Si layer 3 among wavelengths of light which can be converted into electric power by Si is reflected back into Si substrate 1, and the reflected light can then be photoelectrically-converted by Si. More specifically, by providing intermediate semiconductor layer 6, the effect achieved by increasing the thickness of Si substrate 1 can be obtained without actually increasing the weight of the solar cell.

Note that intermediate semiconductor layer 6 does not have to be provided entirely along the boundary between p⁺ type Si layer 3 and $Si_{1-x}Ge_x$ layer 4.

In the solar cell in FIG. 2B, p⁺ type intermediate semiconductor layer 6a is formed partially along the boundary of p⁺ type Si layer 3 and p⁺ type $Si_{1-x}Ge_x$ layer 4. The lattice constants are not the same as that of Si, and it is therefore preferable for intermediate semiconductor layer 6a to be partially formed and buried by $Si_{1-x}Ge_x$ layer 4. In order to bury the partially formed intermediate semiconductor layer 6a with $Si_{1-x}Ge_x$, the growth rate of layer 4 $Si_{1-x}Ge_x$ layer 4 in the direction of widening within the surface is made larger than in the direction of the thickness upon its deposition. It is speculated from a technique of growing a III-V group compound semiconductor thin film that selecting the (110) plane as a main plane of Si substrate 1 for example may permit such growth of $Si_{1-x}Ge_x$ layer 4.

The solar cell in FIG. 2C includes a plurality of p⁺ type intermediate semiconductor layers 6a and 6b formed partially along a plurality of surfaces parallel to the boundary between p⁺ type Si layer 3 and p⁺ type $Si_{1-x}Ge_x$ layer 4. The partial formation regions of first intermediate semiconductor layer 6a and second intermediate semiconductor layer 6b are preferably shifted from each other so that a desired effect of optical reflection can be achieved and the flow of minority carriers is not hindered as well.

FIGS. 5A to 5F illustrate an example of a method of manufacturing a cell corresponding to the solar cell shown in FIG. 2B.

Figure 5A:
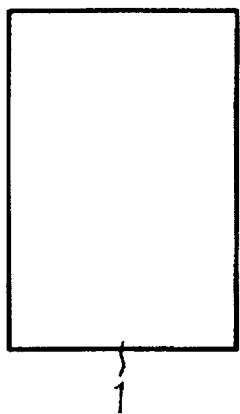
FIGS. 5A to 5F are schematic cross-sectional views for use in illustrating the steps of manufacturing a cell corresponding to the solar cell in FIG. 2B.

In FIG. 5A, a p⁻ type Si substrate 1 having a thickness in the range from 30 µm to 500 µm is prepared. Si substrate 1 preferably has a (110) main plane.

Figure 5B:
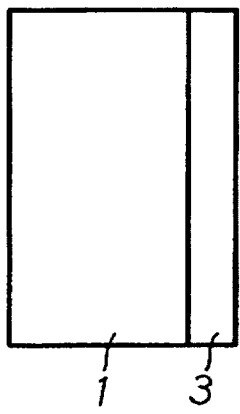

In FIG. 5B, a p_layer 3 is formed on the back surface of Si substrate 1 by thermal diffusion as is the case with the cell shown in FIG. 1(A). This p⁺ layer 3 is further implanted with Ge ions by means of ion implantation. The Ge ion implantation provides an effect of alleviating lattice mismatch with a $Si_{1-x}Ge_x$ layer 6 to be later formed. As for implantation conditions, a suitable implantation energy in the range from 10 keV to 200 keV for example and a suitable dose in the range from $1 \times 10^{15}$ to $1 \times 10^{18} cm^{-2}$ may be used. Substrate 1 having Ge ions implanted into its p⁺ layer 3 is then annealed at a suitable temperature in the range from 500° C. to 900° C., and substrate 1 is thus activated. Note that p⁺ layer 3 may be formed by implanting boron ions, in which case a p⁺ layer may be formed irrespective of before or after Ge ion implantation.

Figure 5C:
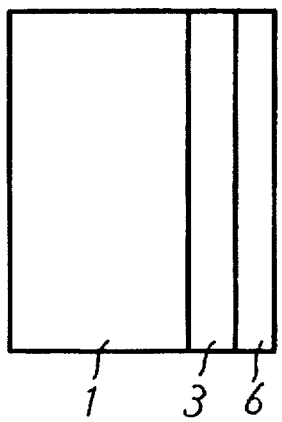

In FIG. 5C, an intermediate semiconductor layer 6 is formed on a p⁺ layer 3 containing implanted Ge. For forming intermediate semiconductor layer 6, $SiH_4$ and $N_2O$ may be allowed to react at about 650° C. by means of CVD for example to form $SiO_x$. Furthermore, for forming intermediate semiconductor layer 6, $SiH_4$ and $NH_3$ may be allowed to react at about 400° C. to form $SiN_x$. Further, for forming intermediate semiconductor layer 6, $SiHCl_3$ and $C_3H_8$ may be allowed to react at a temperature of about 1000° C. under a reduced pressure of about 200 Pa to form SiC. Upon forming such intermediate semiconductor layers, adjusting the gas mixture ratio and adding an impurity permits desired $p^+$-doping as well. The material of intermediate semiconductor layer 6 may be appropriately selected taking into consideration the following steps. If thermal diffusion at a relatively high temperature is later employed in a step of forming a p-n junction for example, SiC is preferably selected as the material of intermediate semiconductor layer 6, while if ion implantation or CVD at a relatively low temperature is employed upon forming the p-n junction, $SiO_x$ or $SiN_x$ may be selected.

Figure 5D:
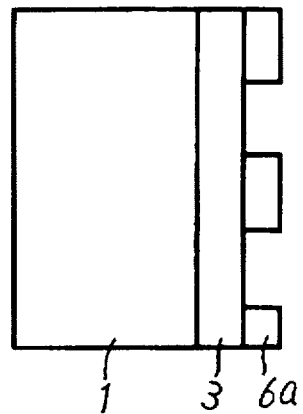

In FIG. 5D, intermediate semiconductor layer 6 is partially windowed by means of a well-known photolithography technique, and the back surface of the substrate is partially exposed. The thus patterned intermediate semiconductor layer 6a may also be formed by means of a well-known selective growth technique rather than the photolithography technique. In that case, intermediate semiconductor layer 6a directly patterned on $p^+$ layer 3 in FIG. 5B may be formed omitting the step shown in FIG. 5C.

Figure 5E:
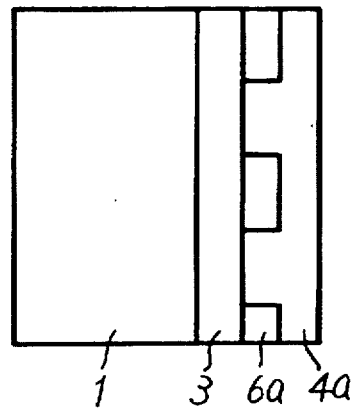

In FIG. 5E, a $p^+$ type $Si_{1-x}Ge_x$ layer 4a is deposited by means of CVD, wherein a gas mixture containing $GeH_4$, $SiH_4$ and a p type impurity is thermally decomposed at a temperature in the range from about 700° C. to about 1000° C. $P^+$ type $Si_{1-x}Ge_x$ layer 4a can be deposited by plasma CVD with an RF power of about 300W and at a temperature of about 300° C. Note that the composition ratio x in $Si_{1-x}Ge_x$ layer 4a may be changed by adjusting the composition of the gas mixture.

Figure 5F:
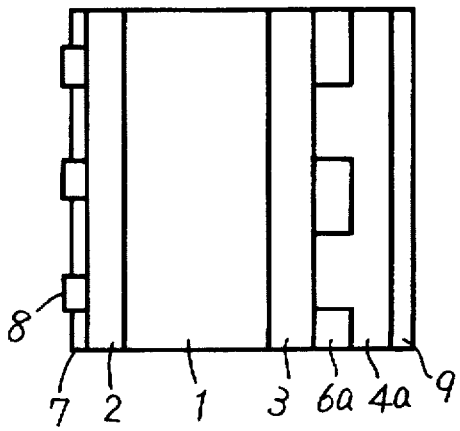

In FIG. 5F, as is the case with the cell in FIG. 1(A), an $n^+$ layer 2 is formed on the front surface of substrate 1 to form a p-n junction. Then, a well known anti-reflective coating 7 and a front surface electrode 8 are formed on $n^+$ layer 2, and a back surface electrode 9 is formed on $Si_{1-x}Ge_x$ layer 4a, thus completing the solar cell.

Figure 6A:
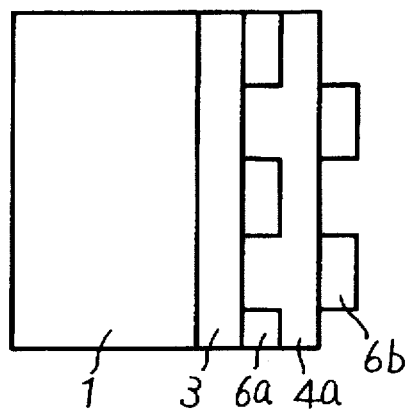
FIGS. 6A, 6B, and 6C are schematic cross-sectional views for use in illustrating the steps of manufacturing a cell corresponding to the solar cell shown in FIG. 2C.
Figure 6B:
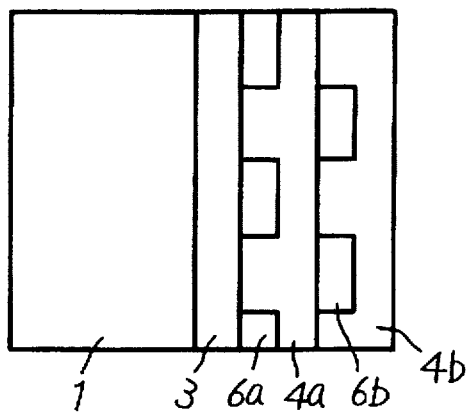
Figure 6C:
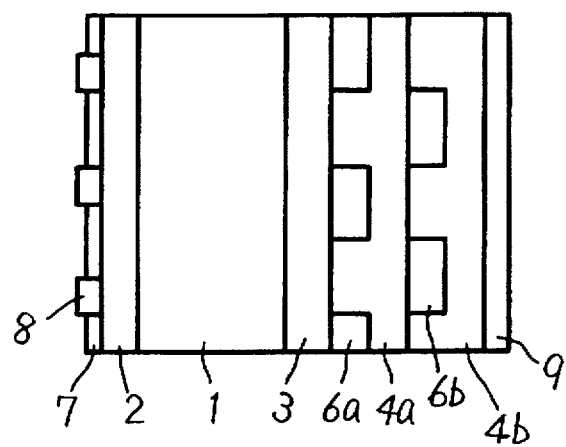
Figure 7A:
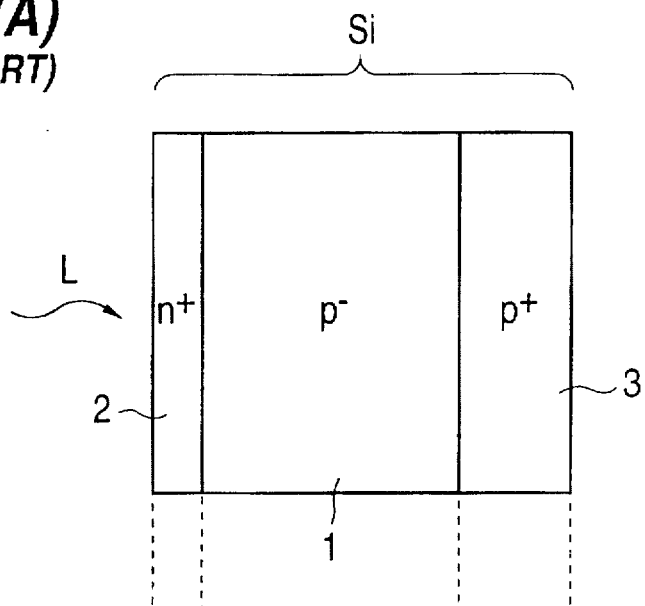
FIGS. 7A and 7B include a cross-sectional view schematically showing an example of a prior art solar cell, and a schematic energy band profile corresponding to the cell.
Figure 7B:
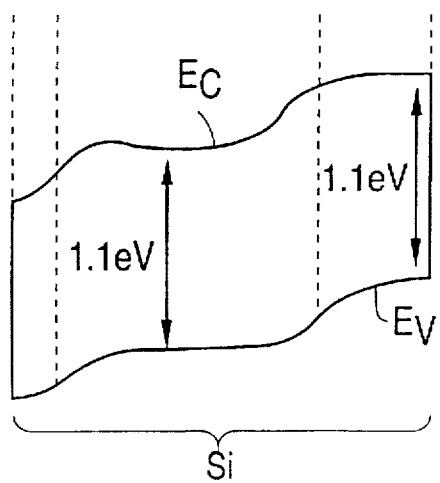

FIGS. 6A to 6C illustrate the steps of manufacturing a cell corresponding to the solar cell shown in FIG. 2C.

FIG. 6A shows the state in which a second intermediate semiconductor layer 6b which is patterned has been formed on $Si_{1-x}Ge_x$ layer 4a. Second intermediate semiconductor layer 6b is formed simultaneously with first intermediate semiconductor layer 6a. At the time, the openings in semiconductor layers 6a and 6b preferably have their positions shifted from each other. Then, light not reflected by first intermediate semiconductor layer 6a can be effectively reflected by second intermediate semiconductor layer 6b. Note that the ratio of opening portions in first intermediate semiconductor layer 6a do not have to agree with the ratio of opening portions in second intermediate semiconductor layer 6b.

In FIG. 6B, second intermediate semiconductor layer 6b is covered with a second $Si_{1-x}Ge_x$ layer 4b. Second $Si_{1-x}Ge_x$ layer can be formed in the same manner as first $Si_{1-x}Ge_x$ layer 4b. In first $Si_{1-x}Ge_x$ layer 4a and second $Si_{1-x}Ge_x$ layer 4b, the values of x representing composition ratios do not have to be the same, and x in second $Si_{1-x}Ge_x$ layer 4b is preferably larger than x in first $Si_{1-x}Ge_x$ layer 4a.

In FIG. 6C, as in FIG. 5F, an $n^+$ layer 2 is formed on the front surface of substrate 1 in order to form a p-n junction.

An anti-reflective coating 7 and a front surface electrode 8 are formed on $n^+$ layer 2, and a back surface electrode 9 is formed on second $Si_{1-x}Ge_x$ layer 4b, thus completing the solar cell.

As described above, according to the present invention, the provision of the $Si_{1-x}Ge_x$ layer on the back surface of the solar cell permits sufficient electric conversion of light with short wavelengths having high energy by the thin $n^+$ layer on the front surface or the relatively thick $p^-$ substrate, while light which has not been converted into electric power by Si having a wide bandgap is converted by the $Si_{1-x}Ge_x$ having a narrow bandgap. Therefore, high photoelectric conversion efficiency can be achieved, and undesired heat produced by light with long wavelengths is reduced, thereby permitting stable cell operation.

In addition, applying ion implantation techniques for forming the $Si_{1-x}Ge_x$ layer alleviates lattice mismatch between the monocrystalline Si substrate and the $Si_{1-x}Ge_x$ layer, and therefore a highly reliable solar cell can be provided.

Furthermore, since the intermediate semiconductor layer reflects incident light back toward the Si substrate, the Si substrate may be formed to be thin. Therefore, the weight of such a solar cell can be reduced and the cell can more preferably be used as a space solar cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar cell, comprising:
   a monocrystalline Si substrate of first conductivity type;
   a diffusion layer of second conductivity type formed on a first main surface of said substrate; and
   a semiconductor layer of the first conductivity type formed on a second main surface of said substrate and having a bandgap narrower than that of Si and a dopant impurity concentration higher than that of said substrate.

2. The solar cell as recited in claim 1, wherein said semiconductor layer having the narrower bandgap is a Si-Ge alloy layer.

3. The solar cell as recited in claim 1, wherein said semiconductor layer having the narrower bandgap is a Ge layer.

4. The solar cell as recited in claim 1, further comprising:
   an intermediate semiconductor layer positioned along at least part of the boundary between said Si substrate and said semiconductor layer having the narrower bandgap, said intermediate semiconductor layer acting as a reflective layer.

5. The solar cell as recited in claim 4, wherein said intermediate semiconductor layer has a refractive index between those of Si and Ge and has a bandgap larger than said semiconductor layer having the narrower bandgap.

6. The solar cell as recited in claim 1, wherein an anti-reflective coating is formed on said diffusion layer.

7. A method of manufacturing a solar cell, comprising the steps of:
   preparing a monocrystalline Si substrate of first conductivity type;
   forming a semiconductor layer of the first conductivity type having a bandgap narrower than that of the Si substrate and a dopant impurity higher than that of the Si substrate on a first main surface of the substrate; and forming a diffusion layer of second conductivity type on a second main surface of the substrate.

8. The method of manufacturing a solar cell as recited in claim 7, wherein the formed semiconductor layer of first conductivity type having a bandgap narrower than that of Si is a Si-Ge alloy layer.

9. The method of manufacturing a solar cell as recited in claim 8, comprising the step of depositing a further Si-Ge alloy on the Si-Ge alloy layer.

10. The method of manufacturing a solar cell as recited in claim 8, comprising the step of depositing a Ge layer on the Si-Ge alloy layer.

11. The method of manufacturing a solar cell as recited in claim 8, wherein the Si-Ge alloy layer is formed by implanting Ge ions into the first main surface of the substrate.

12. The method of manufacturing a solar cell as recited in claim 4, further comprising the step of:

forming an intermediate semiconductor layer along at least part of the boundary between the Si substrate and the semiconductor layer having the narrower bandgap.

13. The method of manufacturing a solar cell as recited in claim 12, wherein the intermediate semiconductor layer has a refractive index between those of Si and Ge and has a bandgap larger than the formed semiconductor layer having the narrower bandgap.

14. The method of manufacturing a solar cell as recited in claim 13, further comprising the step of:

forming a second intermediate semiconductor layer parallel to the boundary between the Si substrate and the semiconductor layer having the narrower bandgap, the second intermediate semiconductor layer having similar light refracting properties as the first intermediate semiconductor layer.

15. The method of manufacturing a solar cell as recited in claim 13, wherein the intermediate semiconductor layer is formed of one of $SiO_x$, $SiN_x$, and SiC.

16. A solar cell, comprising:

a monocrystalline Si substrate of first conductivity type;

a diffusion layer of second conductivity type formed on a first main surface of said substrate;

a $Si_{1-x}Ge_x$ ($0 < x \leq 1$) alloy layer formed on a second main surface of said substrate; and an intermediate semiconductor layer formed along at least a portion of the boundary between said Si substrate and said $Si_{1-x}Ge_x$ layer, said intermediate semiconductor layer having an intermediate refractive index between those of Si and of Ge and having an energy bandgap larger than the energy bandgap of said $Si_{1-x}Ge_x$ alloy layer.

17. The solar cell as recited in claim 16, wherein said intermediate semiconductor layer has $p^+$ type conductivity.

18. The solar cell as recited in claim 16, further comprising at least one additional intermediate semiconductor layer having the same refractive index property as said intermediate semiconductor layer, wherein said additional intermediate semiconductor layer is provided parallel to said boundary in a portion of said $Si_{1-x}Ge_x$ alloy layer.

19. The solar cell as recited in claim 18, wherein portions of said plurality of intermediate semiconductor layers are shifted from each other in a direction parallel to said boundary.

20. The solar cell as recited in claim 16, wherein said first and second main surfaces of said Si substrate are planar.

21. The solar cell as recited in claim 16, wherein said intermediate layer includes at least one material selected from $SiO_x$, $SiN_x$, and SiC.

* * * * *